United States Patent [19]

Premerlani

[11] Patent Number: 4,674,062

[45] Date of Patent: Jun. 16, 1987

[54] APPARATUS AND METHOD TO INCREASE DYNAMIC RANGE OF DIGITAL MEASUREMENTS

[75] Inventor: William J. Premerlani, Scotia, N.Y.

[73] Assignee: General Electric Company, Schenectady, N.Y.

[21] Appl. No.: 602,290

[22] Filed: Apr. 20, 1984

[51] Int. Cl.$^4$ .......................... G06F 15/46; G06J 1/00; H03K 4/02

[52] U.S. Cl. .................................. 364/602; 364/600; 340/347 AD

[58] Field of Search ............... 364/602, 600, 606, 724; 340/347 AD, 500, 511, 347 CC; 324/76 R, 78 D, 78 F; 73/2 R

[56] References Cited

U.S. PATENT DOCUMENTS

| | | | |
|---|---|---|---|
| 3,889,108 | 6/1975 | Cautrell | 364/724 |
| 3,978,418 | 8/1976 | Loun | 330/256 |
| 4,023,019 | 5/1977 | Leibowitz et al. | 364/733 |
| 4,034,367 | 7/1977 | Susiyama et al. | 340/347 AD |
| 4,136,326 | 1/1979 | Naudot et al. | 367/39 |
| 4,179,687 | 12/1979 | Van de Plassche et al. | 340/347 AD |
| 4,232,373 | 11/1980 | Jackson et al. | 364/724 |
| 4,355,304 | 10/1982 | Kassuga et al. | 364/606 X |
| 4,361,831 | 11/1982 | Grützediek | 340/347 AD X |
| 4,493,091 | 1/1985 | Gundry | 340/347 AD X |
| 4,509,037 | 4/1985 | Harris | 340/347 AD |
| 4,542,349 | 9/1985 | Hoest | 330/279 |

Primary Examiner—Joseph Ruggiero
Assistant Examiner—Charles B. Meyer
Attorney, Agent, or Firm—Bernard J. Lacomis; James C. Davis, Jr.

[57] ABSTRACT

Disclosed is a method for overcoming one of the limiting factors in applying digital techniques to measuring analog signals over a wide dynamic range, namely, the uncertainty introduced into the measurement by noise and A/D conversion, particularly at low signal levels. A central feature of the technique is the filtering of the signal with a variable time constant digital filter, the time constant being a function of the measured signal in such way as to increase the effective resolution of small signals at the expense of an increased transient delay. For large signals, the time constant is reduced so that adequate transient response is provided when it is most needed and when there is already adequate resolution.

4 Claims, 8 Drawing Figures

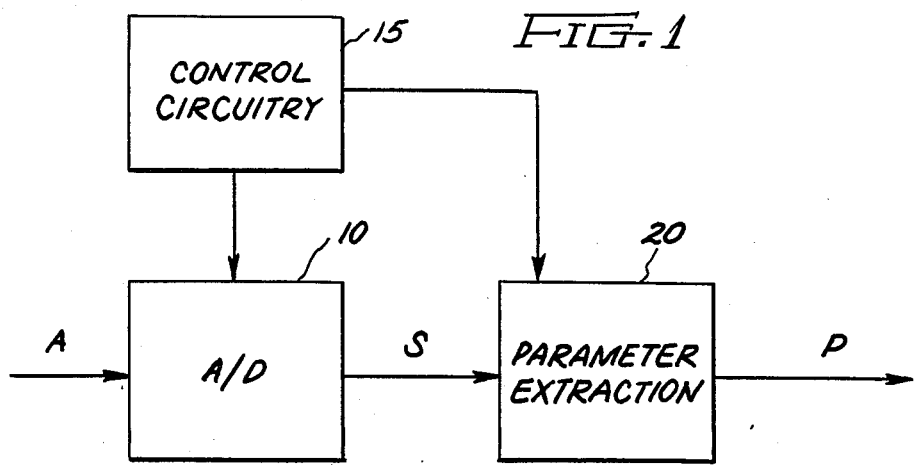
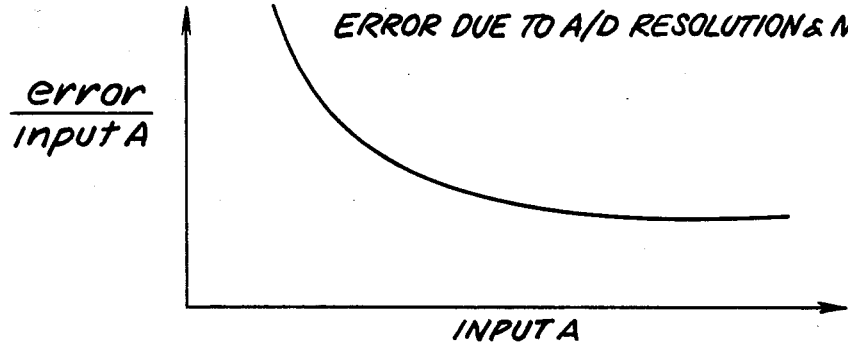
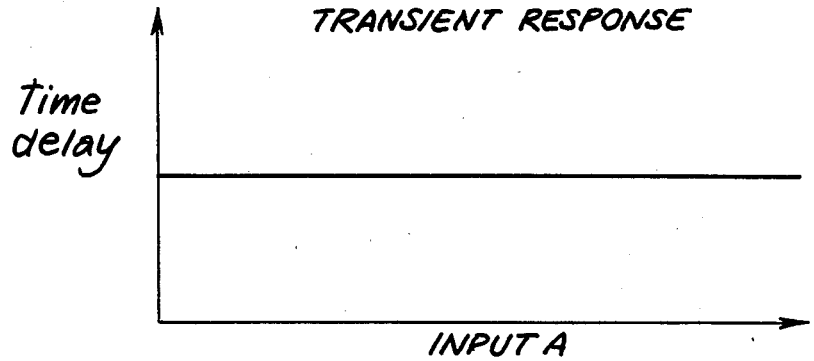

ERROR DUE TO A/D RESOLUTION & NOISE

TRANSIENT RESPONSE

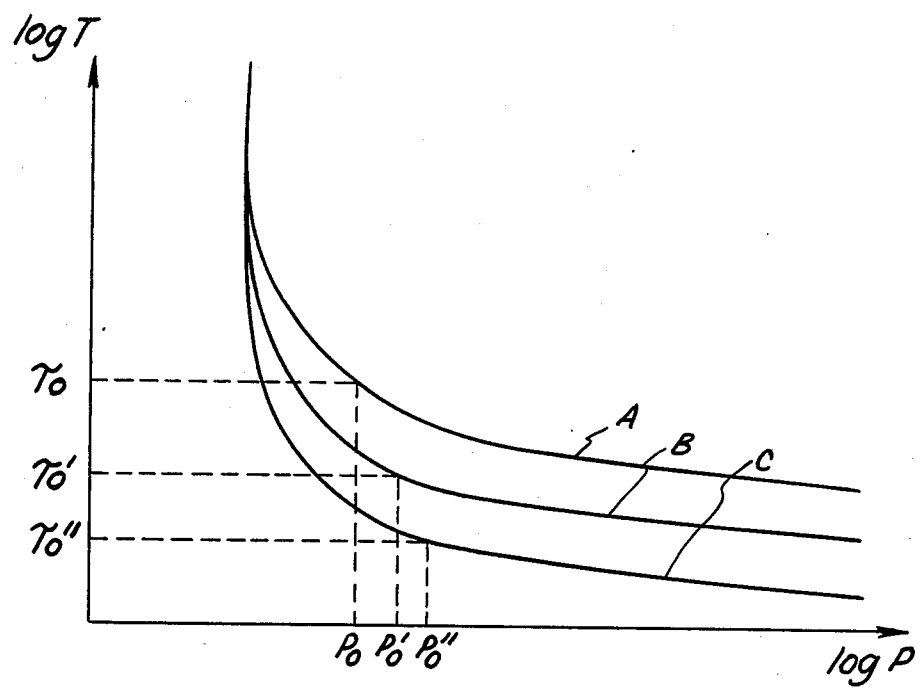

APPARATUS AND METHOD TO INCREASE DYNAMIC RANGE OF DIGITAL MEASUREMENTS

BACKGROUND OF THE INVENTION

This invention relates to digital measurements and, more particularly, to a method and apparatus for increasing the dynamic range of digital measurements.

It is typically desirable to measure an analog signal using digital techniques, such as include discrete sampling of the analog signal and analog-to-digital (A/D) conversion, over a wide dynamic range of the analog signal. A limiting factor in applying measurement techniques of conventional systems is uncertainty introduced into the measurement by noise and by A/D conversion, particularly at low analog signal levels, i.e. low signal-to-noise ratio.

Classes of operations in which measurement of an analog signal may be required include: providing an indication of the value or magnitude of the analog signal, such as for a meter or display; and, supplying monitoring and/or protection circuitry, wherein predetermined thresholds are established and conditions above and/or below threshold are used to actuate alarms and/or protective circuitry. Examples of the latter include under/over current or voltage, under/over frequency, under/over temperature, under/over velocity (speed), under/over pressure, over stress, over concentration as in smoke detectors and gas detectors (snifters), or any other variable wherein exceeding and/or operating below a predetermined threshold may be indicated or automatically actuate a response, e.g. switching protective circuitry into operation, flashing lights, signaling with bells, whistles or sirens.

Conventional methods for obtaining digital measurement of an analog signal over a wide dynamic range include: using a linear A/D converter having a large number of bits (e.g. greater than about 10) and designing associated analog circuitry for low noise; compressing the dynamic range of an analog signal using a non-linear amplifier, e.g. logarithmic, supplying the resulting compressed analog signal to an A/D converter and decompressing or expanding the digitized output of the A/D converter, such as with a look-up table; and using an A/D converter for more than one range with range switching performed as a function of input analog signal amplitude by hardware or under software control. All these methods are ultimately limited by noise in the "front end" (i.e. before the A/D conversion circuitry) of the measuring device.

In his experience with monitoring and protection systems, applicant has observed that for many systems, the value of an actual system parameter does not experience large changes during relatively short intervals, especially once the system has reached a steady-state operating condition. It is applicant's intention to use additional time available due to the above-noted observation for increasing the accuracy of system monitoring and protection and also to provide an override scheme for rapidly reacting to any large changes in the actual system parameter which may occur.

Accordingly, it is an object of the present invention to provide a method and apparatus for increasing the dynamic range of digital measurements in order to achieve high accuracy for small analog input signals without sacrificing transient response for large analog input signals.

Another object is to increase the dynamic range of digital measurements by minimizing effects from noise and A/D conversion errors without extensive and/or expensive hardware modification.

The features of the invention believed to be novel are set forth with particularity in the appended claims. The invention itself, however, both as to organization and method of operation, together with further objects and advantages thereof, may best be understood by reference to the detailed description taken in connection with the accompanying drawing.

BRIEF DESCRIPTION OF THE DRAWING

FIG. 1 is a block diagram of a typical digital parameter extraction;

FIGS. 2a and 2b are diagrams of error and transient performance, respectively, of typical digital measurement;

FIG. 5 is a diagram of a filter time constant curve indicating preselected operational strategies in accordance with the present invention.

DETAILED DESCRIPTION

Referring to FIG. 1, a block diagram of a typical digital measuring device is shown. The measuring device comprises an analog-to-digital (A/D) converter 10, control circuitry 15 and a parameter extraction means 20, such as a microprocessor. Control circuitry 15 may be part of microprocessor 20. In operation, an analog signal A is provided to A/D converter 10. Control circuitry 15 supplies appropriate timing signals to A/D converter 10 to generate digital samples S, representative of analog signal A, at desired intervals. Digital samples S are supplied to parameter extraction means 20, which receives appropriate timing signals from control circuitry 15 and, in accordance with a preselected parameter extraction technique, operates on samples S provided thereto to create parameter P, indicative of a desired feature of analog signal A, such as, for example, RMS, peak or average value over a cycle of a periodic analog signal A.

Referring to FIGS. 2a and 2b, typical performance of the device of FIG. 1 is shown. There exists a random statistical variation in parameter P due mainly to error, e.g. round-off which is typically ±½ least significant bit (LSB) of A/D converter 10 (FIG. 1) and to noise. The absolute error is constant. As shown in FIG. 2a, this causes the relative error, i.e. absolute error divided by input vs. input, to grow larger as the amplitude of analog signal A becomes smaller. As shown in FIG. 2b, transient response is typically a constant time delay regardless of the amplitude, within the operating range of the system, of analog signal A. The magnitude of the time delay is generally a function of the parameter extraction technique used by parameter extraction means 20 (FIG 1).

Figure 3:
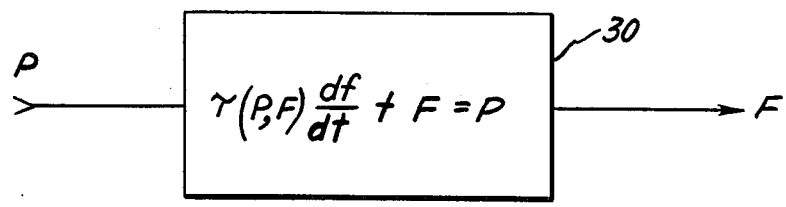
FIG. 3 is a block diagram of a variable time constant filter in accordance with the present invention.

Referring to FIG. 3, a filter 30, in accordance with the present invention, is shown. Filter 30 may be coupled to an output of parameter extraction means 20 (FIG. 1) having parameter P available thereat. Filter 30 includes a predetermined time constant $\tau$, which is a function of both of parameter P input to filter 30 and of filtered output signal F from filter 30, i.e. $\tau(P,F)(dF/dt)+F=P$. The time constant function $\tau$ of parameter P and filtered output F is selected to reduce relative error of low signal levels without sacrificing transient response at high signal levels. The optimum filtering time constant function selection will depend on the specific application of the digital measuring device and may readily be determined without undue experimentation by those skilled in the art. It must be remembered that there is a tradeoff between relative error and response time.

Figure 4A:
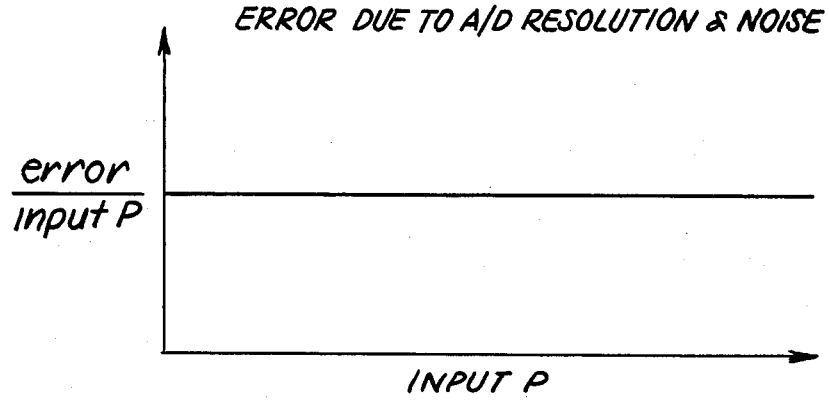
FIGS. 4a and 4b are diagrams of error and transient performance, respectively, of digital measurement in accordance with one aspect of the present invention.
Figure 4B:
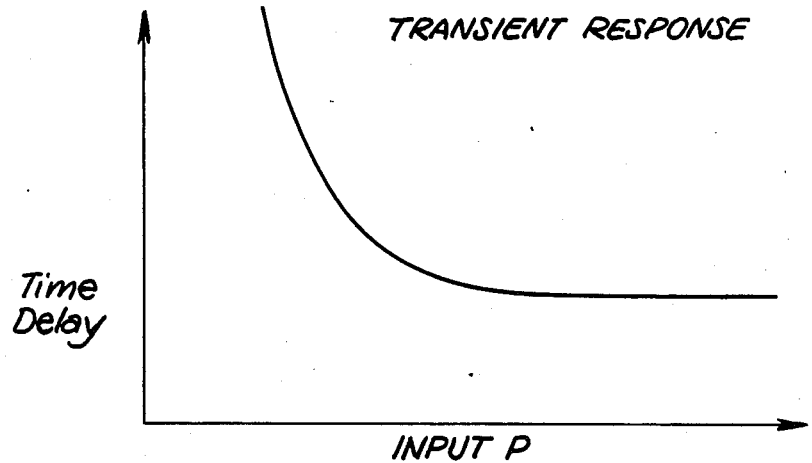

For example, referring to FIGS. 4a and 4b, performance of a time constant function appropriate to applications, such as tripping of circuit breakers which can tolerate a transient response inversely proportional to the amplitude of input P is shown. The time constant is selected to be inversely proportional to the square of the maximum absolute value of parameter P or of filter output F, whichever is greater. That is, $$\tau(P,F) = \tau_0 \left[ \frac{P_0}{\max(|P|,|F|)} \right]^2 = \frac{\tau_0 P_0^2}{[\max(|P|,|F|)]^2} = \frac{K_0}{[\max(|P|,|F|)]^2}$$

wherein, $\tau_o$ = normalizing constant
$P_o$ = normalizing constant
$K_o = \tau_o P_o^2$
$\max(|P|,|F|)$ = maximum of the absolute value of P or of F, whichever is greater.

Normalizing constant $P_o$ is selected to be the value of parameter P input signal to filter 30 (FIG. 3) which causes a response of $\tau_o$, i.e. how much filter delay is tolerable at a given value of P. Normalizing constant $\tau_o$ is selected to be the desired value of the time constant of filter 30 (FIG. 3) for small changes about the value of normalizing constant $P_o$. In general, the time to react or update the system (transient response curve) is selected to provide adequate system protection for a predetermined value of input P. That is, the transient response curve is indicative of potential damage to the system which can be tolerated versus the magnitude of input P.

Using filter 30 (FIG. 3) having a transient response inversely proportional to the amplitude of input parameter P, relative error, as shown in FIG. 4a, can be made constant as a function of input parameter P amplitude while transient delay, as shown in FIG. 4b, increases as the amplitude of parameter P decreases. Noise will prevent the time delay from going to infinity. The maximum of the absolute value of input P to filter 30 (FIG. 3) and output F from filter 30 is used to allow the value of output F from filter 30 to rapidly become zero when input P to filter 30 is removed or decreases rapidly. Likewise, when the value of input P to filter 30 experiences a large increase, the value of output F from filter 30 rapidly increases.

Referring to FIG. 5, a diagram of a generalized filter time constant curve indicating preselected operational strategies in accordance with the present invention is shown. Preselected strategies A, B and C along with associated predetermined operating parameter pairs $P_o$; $\tau_o$, $P_o'$, $\tau_0'$; AND $P_o''$,$\tau_o''$, respectively, are indicated. The ordinate is scaled to indicate the logarithm of time (log T) and the abscissa is scaled to indicate the logarithm of input parameter P (log P) of a filter in accordance with the present invention. Strategies A, B and C indicate how long (log T) an input parameter (log P) at the value of the parameter may exist in a system before some action, such as triggering an alarm or updating a display, must be taken. The curves representing strategies A, B and C are developed as required by the particular application, with the maximum tolerable delay a function of the desired response time.

Figure 6:
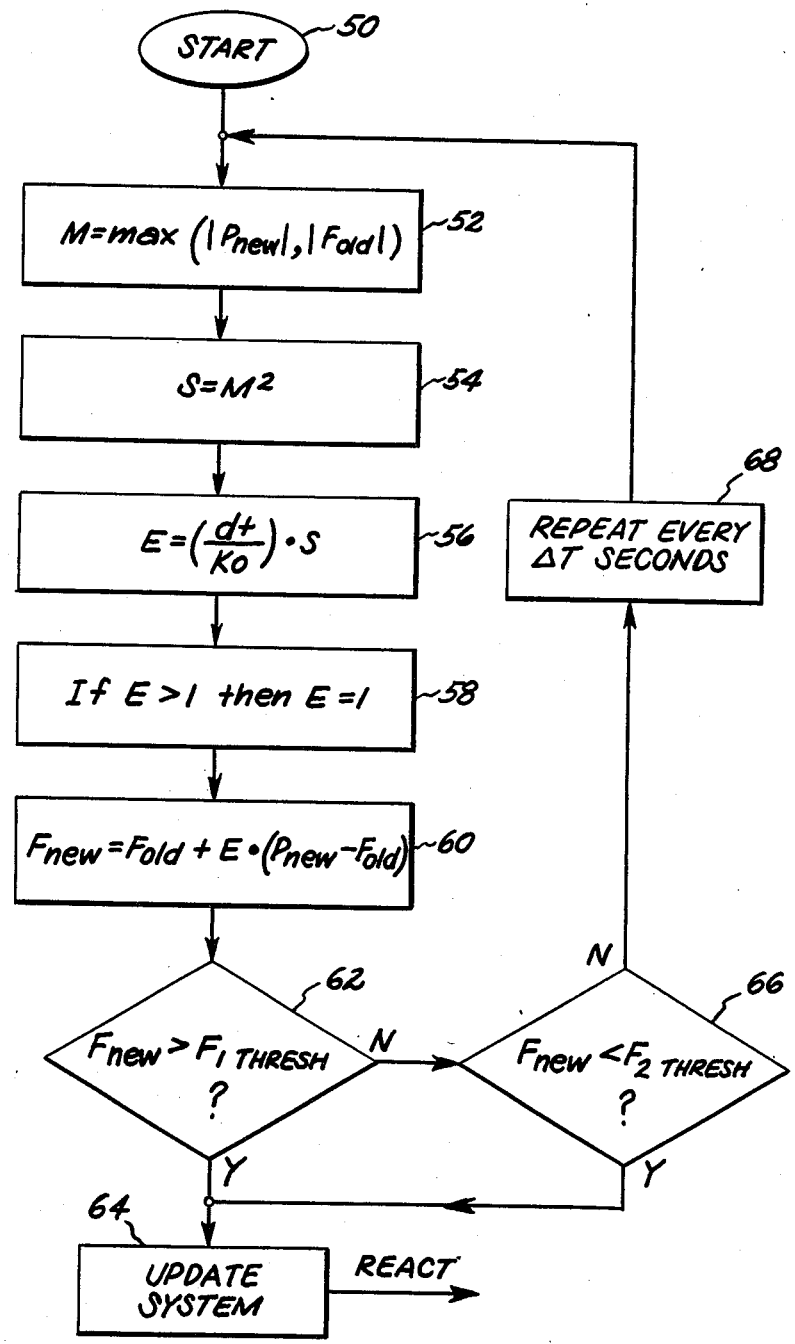
FIG. 6 is a flow diagram of an implementation of the filter of FIG. 3 in accordance with the present invention.

Referring to FIG. 6, a flow diagram of a program for implementation of a filter 30 (FIG. 3), in accordance with the present invention, is shown. Filter 30 (FIG. 3) comprises a microprocessor, such as a model 8051 integrated circuit manufactured by Intel, or the like. A model 8051 integrated circuit includes a read only memory (ROM). If the microprocessor selected does not include a ROM, then a cooperating one may be provided as is known in the art. The program represented by the flow diagram of FIG. 6 may be stored in the ROM associated with the microprocessor of filter 30 (FIG. 3). Alternately, if parameter extraction means 20 of FIG. 1 comprises a microprocessor, then the program represented by the flow diagram of FIG. 6 may be stored therein if there is adequate storage space and processing time available.

The program begins at step 50 and then performs step 52. Execution of step 52 selects the larger of the absolute value of $P_{new}$ or $F_{old}$ and equates it to a variable M. $P_{new}$ is the present value of parameter P and $F_{old}$ is the value of filtered parameter F from the previous iteration of performance of the program of FIG. 6. Performance of step 54 squares the value of variable M and equates the result to variable S. Execution of step 56 multiplies the value of variable S by $dt/K_o$, wherein dt = the time interval between calculations and $K_o = \tau_o P_o^2$ and equates the product to variable E. Performance of step 58 determines if the value of E is greater than 1, and if it is greater than 1, the value of E is set equal to 1. This is done to prevent numerical instability. Execution of step 60 takes the value of $F_{old}$ (i.e. value of $F_{new}$ after previous iteration of program) and adds to it the product of the value of E times the difference in the values of $P_{new}$ and $F_{old}$ and stores the sum of $F_{new}$. Performance of step 62 compares the value of $F_{new}$ with the value of a first predetermined threshold $F_{1THRESH}$. If the value of $F_{new}$ is not greater than the value of $F_{1THRESH}$ when step 62 is performed, then the program proceeds to execute step 66. Performance of step 66 compares the value of $F_{new}$ with the value of a second predetermined threshold $F_{2THRESH}$. If the value of $F_{new}$ is not less than the value of $F_{2THRESH}$ when step 66 is performed then the program proceeds to execute step 68. Execution of step 68 allows the program to be repeated every interval of $\Delta T$ seconds. The value of $\Delta T$ is selected to be compatible with overall system monitoring requirements. It is generally a fraction of the shortest time in which a response to input is required.

If the value of $F_{new}$ is greater than or less than the value of $F_{1THRESH}$ or $F_{2THRESH}$ when steps 62 or 66, respectively, are performed, step 64 is executed to update the monitoring system by providing an update signal REACT. Depending on the nature of the monitoring system, the update signal REACT may be used to set an alarm, update a display, remove electrical power or other input to prevent a potentially dangerous situation, etc.

Thus has been illustrated and described, a method and apparatus for increasing the dynamic range of digital measurements in order to achieve high accuracy for small input signals without sacrificing transient response for large input signals. Further, the apparatus and method described and illustrated increase the dynamic range of digital measurements by minimizing effects from noise and A/D conversion without extensive and/or expensive hardware modification.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. A method for measuring an analog signal using digital techniques in a manner to increase the dynamic range of digital measurements, comprising:

converting an analog signal to a digital signal representative of said analog signal;

operating on said digital signal to extract a predetermined parameter, (P), representative of a feature of said analog signal, from said digital signal;

generating an output signal (F) from said predetermined parameter (P) such that the relationship between F and P is $$\tau(P,F)\frac{dF}{dt} + F = P,$$

wherein $\tau(P,F)$ is selected to reduce relative error of small values of said predetermined parameter without reducing transient response to large values of said predetermined parameter.

2. The method as in claim 1, wherein $\tau(P,F)$ is selected to satisfy the relationship $$\tau(P,F) = \tau_0 \left[ \frac{P_0}{\max(|P|,|F|)} \right]^2$$

wherein:

$\tau_o$ = normalizing constant $P_o$ = normalizing constant $\max(|P|,|F|)$ = maximum of the absolute value of P or F, whichever is greater.

3. The method as in claim 2 further comprising:

comparing the value of said output signal with a first predetermined threshold; and generating a react signal when the value of said output signal is greater than said first predetermined threshold.

4. The method as in claim 3, further comprising:

comparing the value of said output signal with a second predetermined threshold when the value of said output signal is not greater than said first predetermined value; and generating said react signal when the value of said output signal is less than said second predetermined threshold.

* * * * *